United States Patent
Tan

(10) Patent No.: US 9,136,207 B2
(45) Date of Patent: Sep. 15, 2015

(54) CHIP PACKAGING STRUCTURE OF A PLURALITY OF ASSEMBLIES

(71) Applicant: Silergy Semiconductor Technology (Hangzhou) LTD, Hangzhou, ZheJiang Province (CN)

(72) Inventor: Xiaochun Tan, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 14/077,376

(22) Filed: Nov. 12, 2013

(65) Prior Publication Data
US 2014/0159218 A1    Jun. 12, 2014

(30) Foreign Application Priority Data

Dec. 11, 2012    (CN) .......................... 2012 1 0537699

(51) Int. Cl.
*H01L 23/498* (2006.01)
*H01L 23/495* (2006.01)

(52) U.S. Cl.
CPC .......... *H01L 23/495* (2013.01); *H01L 23/4951* (2013.01); *H01L 2224/32145* (2013.01); *H01L 2224/48091* (2013.01); *H01L 2224/48465* (2013.01); *H01L 2224/73253* (2013.01); *H01L 2224/73265* (2013.01); *H01L 2924/30107* (2013.01)

(58) Field of Classification Search
CPC .... H01L 23/495; H01L 23/4951; H01F 27/00
USPC .................................................. 257/676, 735
See application file for complete search history.

(56) References Cited

U.S. PATENT DOCUMENTS

| | | | |
|---|---|---|---|
| 6,365,963 B1 * | 4/2002 | Shimada ....................... | 257/686 |
| 7,180,165 B2 * | 2/2007 | Ellsberry et al. .............. | 257/686 |
| 2004/0213042 A1 * | 10/2004 | Johnson ........................ | 365/158 |
| 2004/0262774 A1 * | 12/2004 | Kang et al. .................... | 257/777 |
| 2005/0275061 A1 | 12/2005 | Ohguro | |
| 2009/0039869 A1 * | 2/2009 | Williams .................. | 324/123 R |
| 2010/0127361 A1 * | 5/2010 | Kuan et al. .................... | 257/666 |
| 2011/0134613 A1 | 6/2011 | Moussaoui | |
| 2012/0044656 A1 * | 2/2012 | Lu et al. ........................ | 361/748 |
| 2012/0299170 A1 * | 11/2012 | Kehrer et al. ................. | 257/673 |
| 2012/0322202 A1 | 12/2012 | Nishimura | |
| 2013/0299957 A1 * | 11/2013 | Kobayashi et al. ........... | 257/676 |

FOREIGN PATENT DOCUMENTS

| | | | | |
|---|---|---|---|---|
| CN | 101241904 A | | 8/2008 | |
| CN | 101615609 A | | 12/2009 | |
| WO | WO 2012107972 | * | 8/2012 | .................... 257/676 |

* cited by examiner

*Primary Examiner* — Walter H Swanswon
(74) *Attorney, Agent, or Firm* — Michael C. Stephens, Jr.

(57) ABSTRACT

Disclosed herein are chip packaging structures for packaging multiple assemblies therein. In one embodiment, a chip packaging structure can include: (i) a first assembly located at a bottom layer of the chip packaging structure; (ii) at least one second assembly located above the first assembly, where the second assembly is electrically connected to the first assembly by a plurality of first protruding structures located under the second assembly; (iii) at least one third assembly located above the second assembly, where the third assembly is electrically connected to the first assembly by a plurality of second protruding structures located outside of the second assembly; and (iv) where a first portion of the third assembly and the plurality of second protruding structures form a bent structure substantially perpendicular to a second portion of the third assembly.

13 Claims, 4 Drawing Sheets

CHIP PACKAGING STRUCTURE OF A PLURALITY OF ASSEMBLIES

RELATED APPLICATIONS

This application claims the benefit of Chinese Patent Application No. 201210537699.6, filed on Dec. 11, 2012, which is incorporated herein by reference in its entirety.

FIELD OF THE INVENTION

The present invention relates to the field of semiconductor packaging, and more particularly to a chip packaging structure having a plurality of assemblies therein.

BACKGROUND

With the increasing demands for miniaturization, as well as light-weight and multiple-functional electronic components, semiconductor packaging structure requirements for reduced package volume are increasing. In particular, multi-chip packaging structures are becoming increasingly important. However, in such multi-chip semiconductor packaging structures, connections between the chips may have a crucial impact on package size and device performance.

SUMMARY

In one embodiment, a chip packaging structure can include: (i) a first assembly located at a bottom layer of the chip packaging structure; (ii) at least one second assembly located above the first assembly, where the second assembly is electrically connected to the first assembly by a plurality of first protruding structures located under the second assembly; (iii) at least one third assembly located above the second assembly, where the third assembly is electrically connected to the first assembly by a plurality of second protruding structures located outside of the second assembly; and (iv) where a first portion of the third assembly and the plurality of second protruding structures form a bent structure substantially perpendicular to a second portion of the third assembly.

Embodiments of the present invention can provide several advantages over conventional approaches, as may become readily apparent from the detailed description of preferred embodiments below.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
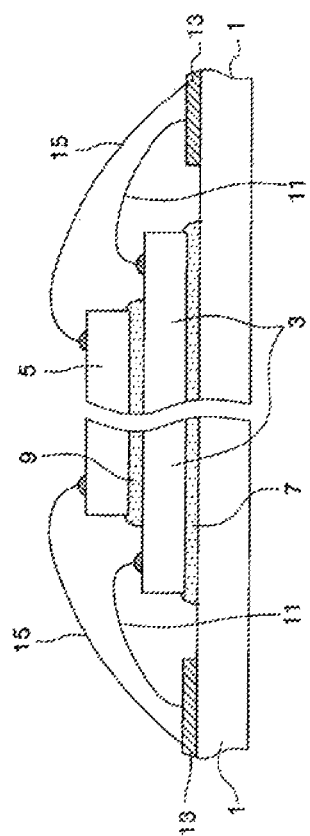
FIG. 1 is a cross-section diagram of an example multi-chip packaging structure.

Referring now to FIG. 1, shown a cross-section view of an example multi-chip packaging structure. In this example, bottom layer chip 3 and upper layer chip 5 can be stacked on printed-circuit board (PCB) 1. A surface of bottom layer chip 3 can connect to the upper surface of PCB 1 through adhesive 7. Also, a surface of upper layer chip 5 can connect to the other surface of bottom layer chip 3 through adhesive 9. In order to expose the pads (for bonding wires) along the top edge of bottom layer chip 3, a width of upper layer chip 5 should be less than a width of bottom layer chip 3.

Solder or metal pads on bottom layer chip 3 and upper layer chip 5 can be electrically connected (e.g., at pads 13) to PCB 1 through bonding wires 11 and bonding wires 15, respectively. Therefore, a height of bonding wires 15 can be greater than that of upper layer chip 5. Because of this arrangement, a thickness of the plastic shell for packaging bonding wires 11, bonding wires 15, upper layer chip 5, and bottom layer chip 3 can be relatively large. Further, due to interference that may be caused by caused by the inductance and/or resistance of the bonding wires, the high frequency performance of the chips may be limited by this type of package structure.

In one embodiment, a chip packaging structure can include: (i) a first assembly located at a bottom layer of the chip packaging structure; (ii) at least one second assembly located above the first assembly, where the second assembly is electrically connected to the first assembly by a plurality of first protruding structures located under the second assembly; (iii) at least one third assembly located above the second assembly, where the third assembly is electrically connected to the first assembly by a plurality of second protruding structures located outside of the second assembly; and (iv) where a first portion of the third assembly and the plurality of second protruding structures form a bent structure substantially perpendicular to a second portion of the third assembly.

Figure 2:
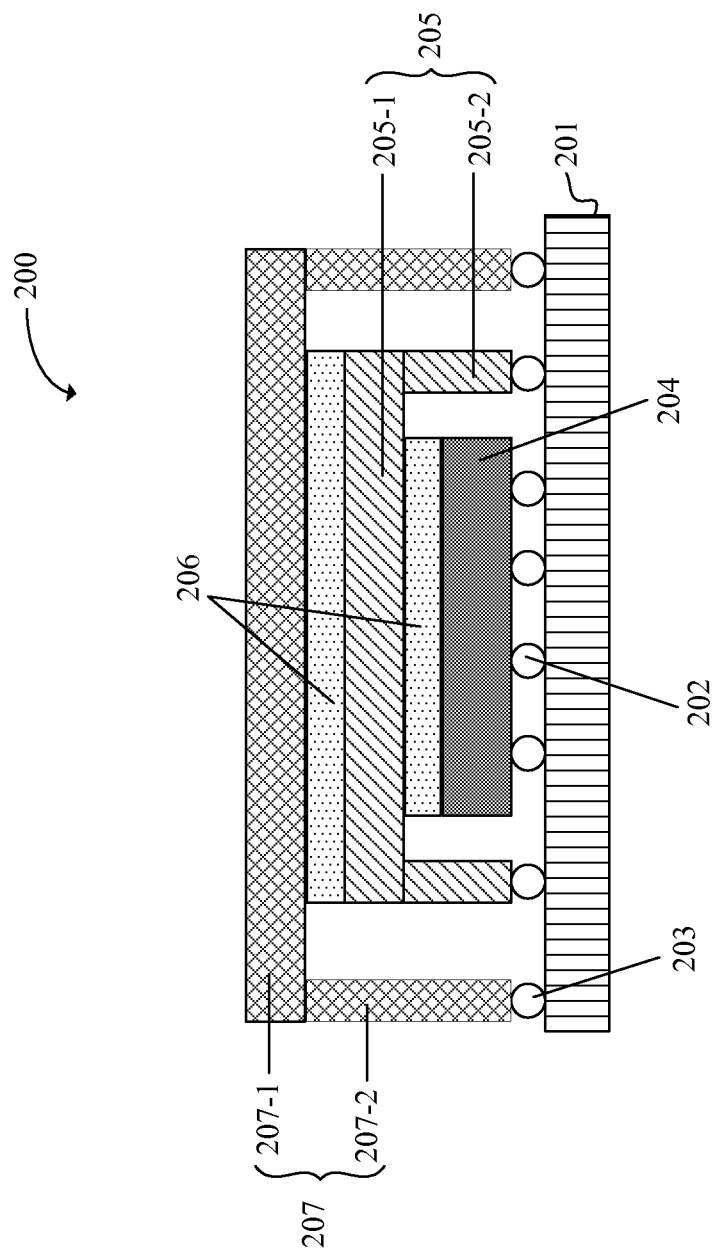
FIG. 2 is a cross-section diagram of a first example chip packaging structure of a plurality of assemblies, in accordance with embodiments of the present invention.

Referring now to FIG. 2, shown is a cross-section view of a first example chip packaging structure of a plurality of assemblies, in accordance with embodiments of the present invention. In this particular example, packaging structure 200 having a plurality of assemblies can include PCB 201 located on the bottom layer, chip 204 located above PCB 201, and chip 205 located above or stacked on chip 204 and inductor 207. For example, PCB 201 can be referred to as a first assembly, chip 204 can be referred to as a second assembly, and chip 205 and/or inductor 207 can be referred to as a third assembly. Further, as described herein, "above," "on," "bent," "stack," and other terms describing the assemblies or connections therebetween may indicate relative arrangements without limiting the orientation of the overall package structure.

Here, chip 204, chip 205, and inductor 207 can be electrically isolated without any separate connections (e.g., solder balls, bumps, etc.). In this example, chip 204 can be electrically connected to PCB 201 through solder balls 202. Also, chip 205 and inductor 207 can be electrically connected to PCB 201 through solder balls 203 located outside, or at outer sides or extending past a periphery, of chip 204. As described herein, solder balls 202 can be referred to as a first connection structure, and solder balls 203 can be referred to as a second connection structure. Magnetic element or inductor 207 can be a chip having integrated circuits thereon. Also, chips 204, 205, and/or 207 may include any type of integrated circuits (e.g., memory circuits, power regulation circuits, light-emitting diode [LED] driver circuits, charger circuits, etc.)

Chips 205 and/or inductor 207 can include different portions having different orientations (e.g., perpendicular) relative to each other. For example, chip 205 can include a straight line portion 205-1 and two bent portions 205-2. Straight line portion 205-1 can be located above and substantially parallel to chip 204, and bent portions 205-2 can be located on either side of chip 204. Bent portion 205-2 can connect to straight line portion 205-1, and also to PCB 201 through solder balls 203. Similarly, inductor 207 can include straight line portion 207-1 and two bent portions 207-2. Straight line portion 207-1 can be located above and substantially parallel to straight line portion 205-1 of chip 205. Bent portion 207-2 can be located outside of, and substantially parallel to, bent portion 205-2 of chip 205. Also, bent portion 207-2 can connect to straight line portion 207-1, and to PCB 201 through solder balls 203.

Chip 205, PCB 201, and solder balls 203 can collectively form a U-shaped or bent structure. In this particular example, the bent portion of the third assembly (e.g., chip 205 and inductor 207) can be electrically connected to the PCB, and may also mechanically support the third assembly along with PCB. In order to achieve better isolation between different assemblies and better stability, packaging structure 200 can also include adhesive layers 206 located between chip 204, chip 205, and inductor 207. Adhesive layers 206 (e.g., non-conductive film, epoxy, etc.) can aid in fixing positions between the various assemblies, and may also strengthen the entire chip packaging structure.

Those skilled in the art will recognize that the particular number of the second assemblies (e.g., chip 204) located above the first assembly (e.g., PCB 201) may not be limited to one, and can be more than one (e.g., two, three, etc.). Also, any number of second assemblies can be separately arranged without electrical connection other than the first assembly. Third assemblies can also cover the area or top surface of the second assemblies, and can be located above all the second assemblies. Other additional assemblies can also be included in certain embodiments. In addition, the first assembly located at bottom layer can alternatively include a lead frame with a plurality of pins. In this case, polarities (e.g., different types of pins) of different assemblies can connect to corresponding pins of the lead frame through the first or second connection structures, in order to form pins having the corresponding polarities.

In the chip packaging structure for the plurality of assemblies of FIG. 2, one or more of the assemblies can connect in a flip-chip packaging method. For example, chip 205 can be inverted such that pads can connect via bent portions 205-2. Further, each assembly located on an upper layer can be electrically connected to assemblies located on the bottom layer through bent portions (e.g., 205-2, 207-2). Therefore, the thickness of the overall chip packaging structure can be significantly reduced as compared to other approaches. In addition, by avoiding bonding wires, good mechanical and electrical stability can be achieved, as compared to other approaches.

In addition, as the volume of magnetic components (e.g., inductors) can be relatively large, by adopting the stacked chip packaging structure as described herein, an inductor and associated chips can be packaged in a single packaging structure. Thus, an inductor with a relatively large volume and capacitance can be integrated in the packaging structure, potentially reducing the overall system volume. This structure can effectively utilize the larger inductor area assembly as a type of cover and can enclose the other chips/assemblies (e.g., 204, 205).

Figure 3:
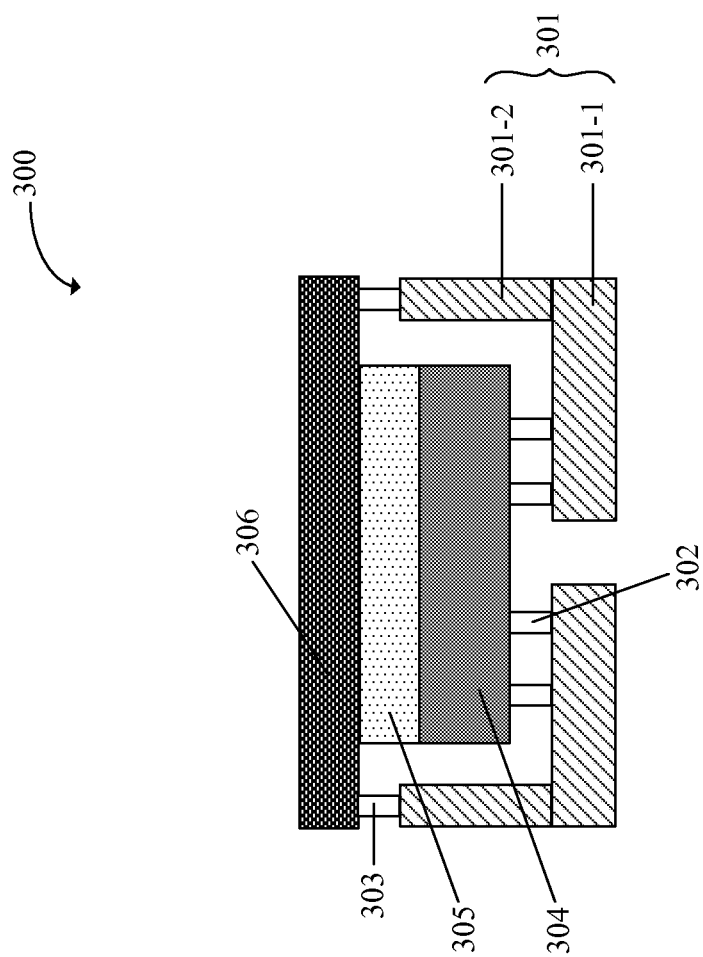
FIG. 3 is a cross-section diagram of a second example chip packaging structure of a plurality of assemblies, in accordance with embodiments of the present invention.

Referring now to FIG. 3, shown is a cross-section view of a second example chip packaging structure of a plurality of assemblies, in accordance with embodiments of the present invention. In this particular example, packaging structure 300 for a plurality of assemblies can include lead frame 301 located on the bottom layer, chip 304 located on lead frame 301, and inductor 306 stacked on chip 304. For example, chip 304 can be electrically connected to lead frame 301 through bumps 302. For example, lead frame 301 can be referred to as a first assembly, chip 304 can be referred to as a second assembly, and inductor 306 can be referred to as a third assembly.

Connection between inductor 306 located on the upper layer and lead frame 301 can be achieved by using bent portions. For example, lead frame 301 can be in a bent structure, which can include straight line portion 301-1 and bent portion 301-2. Bent portion 301-2 can be located outside a periphery of, or at outer sides, of chip 304, and separated from chip 304. Bent portion 301-2 can electrically connect to second straight line portion 301-1, and to inductor 306 through bumps 303. Lead frame 301, inductor 306, and bump 303 can form a U-shaped or bent structure.

Bent portions (e.g., 205-2, 207-2, and 301-2) can be made of any suitable conductive material. For example, the bent portions can be made of a metal (e.g., Cu, Ni, Ag, etc.), or a metal alloy. For example, the process used to form the bent portions can be a standard metallization, via, or through-silicon via (TSV) type of process, and any suitable process can be utilized to form the bent portions. In any event, the bent portions can be used to form electrical connections between the corresponding straight line portion or chip (e.g., 205-1, 207-1, 301-1), such as at a metal pad of the corresponding straight line portion/chip, and another chip or assembly, such as via one or more solder balls or bumps (e.g., 202, 303, etc.). In this way, electrical connections between chips or assemblies can be formed within a packaging structure.

Inductor 306 and chip 304 can be separated from each other without direct connections in some cases to achieve good electrical isolation. Through bent portions of lead frame 301, not only can the electrical connection to assemblies located on upper layers be achieved, but also mechanical support for such assemblies can be realized. In this particular example, chip packaging structure 300 can also include adhesive layer 305 located between chip 304 and inductor 306 to better fix the position therebetween, and also to increase the strength of the entire chip packaging structure. Polarities (e.g., different types of pins or terminals of a power stage circuit) of different assemblies can also connect to corresponding pins of the lead frame through first or second connection structures, so as to form pins having corresponding polarities.

In the chip packaging structure shown in FIG. 3, the assemblies can connect in flip-chip packaging method. Assemblies located on the bottom layer can be electrically connected to assemblies located on the upper layer through bent portions (e.g., 301-2). Therefore, the overall thickness of the chip packaging structure can be significantly reduced. Also, adverse impacts on chip performance through bonding wire connections can be avoided, in order to achieve good mechanical and electrical stability. Particular embodiments are also suitable to a wide variety of circuit types and arrangements.

Figure 4:
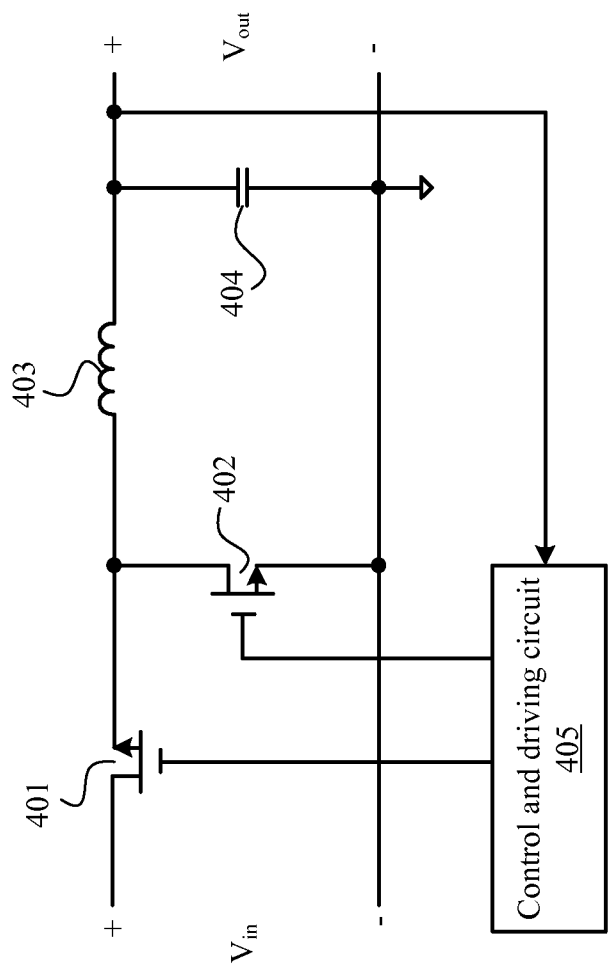
FIG. 4 is a schematic diagram of an example synchronous switching voltage regulator.

Referring now to FIG. 4, shown is a schematic diagram of an example switching voltage regulator. A switching voltage regulator is just one example of the circuitry that can be included in packaging structures 200 and/or 300. In this example, power transistor 401, power transistor 402, inductor 403, and capacitor 404 can form a synchronous buck power stage circuit. In other cases, other types of power stage or converter circuits (e.g., flyback, SEPIC, boost, buck-boost, etc.) can be formed. Control and driving circuit 405 (e.g., including a pulse-width modulation [PWM] controller) can receive an output signal of the power stage circuit, to form a closed-loop feedback control loop to control the switching state of power transistors 401 and 402. In this way, the output signal of the power stage circuit can be controlled to be substantially constant.

The packaging structure 200 and/or 300 can be employed for this type of power circuitry. For example, power transistors 401 and 402 can be integrated into a single chip, and control and driving circuit 405 can be integrated into another chip, and then the two chips can be encapsulated essentially in parallel in the packaging structure. In one example, power transistors 401 and 402 can be integrated in chip 204, control and driving circuit 405 can be integrated in chip 205, and inductor 403 can be integrated in 207. In another example, power transistors 401 and 402, and controlling driving circuit 405 can be integrated in chip 304, and inductor 403 can be integrated in 306.

Of course, other integration or grouping of circuitry into different chips or ICs can be accommodated in particular embodiments. In one example, a multi-chip packaging structure in particular embodiments can include power transistor 401 and power transistor 402 being integrated into a power device chip (e.g., 204), and control and driving circuit 405 being integrated into a control chip (e.g., 205-1). The power device chip can be placed directly on the PCB or lead frame, such that the area of the power device chip can be as close to the area of the chip carrier as possible. Since the power device may process a high voltage and/or a high current, the power device chip with a large area can be able to withstand a relatively high voltage and a relatively high current. Also, the power device may have better thermal characteristics for power supply integration.

For the integrated circuit of the switching voltage regulator shown in FIG. 4, if the carrying capacity of power transistor 402 is greater than that of power transistor 401, power transistor 402 may be much larger than power transistor 401. Thus, power transistor 402 (e.g., the synchronous power device) can be integrated in a single synchronous power device chip, and power transistor 401 (e.g., the main power device) as well as control and driving circuit 405 can be integrated in another single mixed chip. The synchronous power device chip (e.g., 204) can be placed on lead frame or PCB 201. Adhesive layer 206 can be located above the synchronous power device chip, and the mixed chip can be third assembly 205.

In addition, for magnetic components, by adopting the stacked packaging structure, an inductor and associated chips can be packaged in a single packaging structure. Thus, an inductor with relatively large volume and capacitance can be integrated with other chips or devices in the same packaging structure. In this way, the overall system (e.g., a power regulator) can be highly integrated with associated components (e.g., inductors, capacitors, etc.) in a relatively small volume.

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A chip packaging structure, comprising:
 a) a first assembly;
 b) at least one second assembly located above said first assembly, wherein said at least one second assembly is electrically connected to said first assembly by a plurality of first protruding structures located under periphery and internal regions of said at least one second assembly, wherein said at least one second assembly comprises at least one power transistor;
 c) at least one third assembly located above said at least one second assembly, wherein said at least one third assembly is electrically connected to said first assembly by a plurality of second protruding structures located outside of said at least one second assembly, and wherein said at least one third assembly comprises an inductor having bent portions;
 d) wherein a first portion of said inductor and a corresponding of said plurality of second protruding structures form a bent structure substantially perpendicular to a second portion of said inductor, wherein said plurality of second protruding structures are connected between said first portion of said inductor and a top surface of said first assembly, and wherein said inductor is coupled to said at least one transistor in a configuration of a switching voltage regulator; and
 e) wherein an enclosure of said at least one second assembly and any remaining of said at least one third assembly into a single packaging structure comprises said inductor with said bent portions.

2. The chip packaging structure of claim 1, wherein said second portion of said at least one third assembly is located above and without electrical connection to said at least one second assembly.

3. The chip packaging structure of claim 2, wherein said first and second portions are connected together, and wherein said second portion is electrically connected to said first assembly by at least one of said second protruding structures.

4. The chip packaging structure of claim 1, wherein said first assembly comprises a printed-circuit board (PCB).

5. The chip packaging structure of claim 1, wherein said first assembly comprises a lead frame.

6. The chip packaging structure of claim 1, wherein said at least one second assembly comprises a chip.

7. The chip packaging structure of claim 1, wherein said at least one third assembly comprises a chip.

8. The chip packaging structure of claim 1, wherein said switching voltage regulator is configured for a light-emitting diode (LED) driver.

9. The chip packaging structure of claim 1, further comprising first bonding layers between said at least one second assembly and said at least one third assembly.

10. The chip packaging structure of claim 9, wherein said at least one third assembly comprises a pair of third assemblies.

11. The chip packaging structure of claim 10, further comprising a second bonding layer between said pair of third assemblies.

12. The chip packaging structure of claim 1, wherein each of said plurality of first protruding structures and said plurality of second protruding structures comprises bumps.

13. The chip packaging structure of claim 1, wherein each of said plurality of first protruding structures and said plurality of second protruding structures comprises solder balls.

* * * * *